United States Patent [19]

Katoh et al.

[11] Patent Number: 5,001,511
[45] Date of Patent: Mar. 19, 1991

[54] IMAGE RECORDING APPARATUS HAVING EXPOSURE CONTROL UNIT

[75] Inventors: Tokunori Katoh, Ichinomiya; Fumihiro Sunda, Nagoya, both of Japan

[73] Assignee: Brother Kogyo Kabushiki Kaisha, Aichi, Japan

[21] Appl. No.: 377,570

[22] Filed: Jul. 10, 1989

[30] Foreign Application Priority Data

Jul. 11, 1988 [JP] Japan ................................ 63-173294

[51] Int. Cl.$^5$ ............................................ G03B 27/32
[52] U.S. Cl. ......................................... 355/27; 355/35
[58] Field of Search ....................... 355/27, 28, 32, 35, 355/83, 38, 68, 69, 204, 206, 208; 430/138

[56] References Cited

U.S. PATENT DOCUMENTS

| 3,679,306 | 7/1972 | Du Bois et al. | 355/68 |
| 4,124,294 | 11/1978 | Nakamura | 355/68 |
| 4,383,758 | 5/1983 | Honda et al. | 355/68 |
| 4,436,410 | 3/1984 | Komiya | 355/69 X |
| 4,819,022 | 4/1989 | Kurando | 355/208 |
| 4,843,435 | 6/1989 | Horiguchi et al. | 355/27 X |

FOREIGN PATENT DOCUMENTS

| 0133319 | 2/1985 | European Pat. Off. |
| 1571818 | 7/1980 | United Kingdom . |
| 2077449 | 12/1981 | United Kingdom . |
| 2104673 | 3/1983 | United Kingdom . |
| 2118313 | 10/1983 | United Kingdom . |
| 2136589 | 9/1984 | United Kingdom . |

Primary Examiner—L. T. Hix
Assistant Examiner—Khanh Dang
Attorney, Agent, or Firm—Oliff & Berridge

[57] ABSTRACT

In an image recording apparatus for recording an image of an original document on a photosensitive recording sheet, a light source such as a halogen lamp is provided which emits a light and applying it to the image face of the original document while moving the latter. The photosensitive recording sheet is exposed to the resultant image bearing light, in which the photosensitive recording sheet is moved at a speed equal to the moving speed of the original document. A light intensity sensor detects the intensity of the light applied to the original document, and when the intensity of the light applied thereto is lowered than a required level, the moving speeds of both the photosensitive recording sheet and the original document are lowered to thereby maintain an exposure rate at substantially constant.

8 Claims, 3 Drawing Sheets

LENGTH OF HALOGEN LAMP

LENGTH OF HALOGEN LAMP

LENGTH OF HALOGEN LAMP

IMAGE RECORDING APPARATUS HAVING EXPOSURE CONTROL UNIT

BACKGROUND OF THE INVENTION

The present invention relates to the control of an image density in an image recording apparatus such as a copying machine or the like.

Image recording apparatus such as copying machines which employ general photosensitive materials control the density of output images by controlling the intensity of light emitted from the light source. When the intensity of light emitted from the light source is varied due to fluctuation in the voltage of a power supply, it is general to measure the light intensity with a light intensity sensor and control the light source to emit light at a proper intensity level based on the measured light intensity.

A generally used photosensitive material such as PPC or the like is highly sensitive and can sufficiently be exposed to light at a relatively low intensity level. Therefore, it is easy to increase the intensity of light from the light source for controlling the light intensity to compensate for fluctuations in the power supply voltage or to lower the density of images to be formed.

There have also been employed less sensitive photosensitive materials such as a microcapsule-coated sheet and a color developer sheet. These less sensitive photosensitive materials are required to be exposed to light having a very high intensity. Since the intensity of light emitted from the light source is limited by the limited capacities of the lamp of the light source and the power supply coupled to the light source, required light intensities may not be obtained when it is desired to increase the light intensity to lower the density of images to be generated by the image recording apparatus or when the voltage applied by the power supply is lowered.

Heretofore, in the event of a light intensity shortage, an error indication representing such a light intensity shortage is given and then the image recording apparatus is shut off in order to prevent defective images from being formed by the image recording apparatus.

SUMMARY OF THE INVENTION

The present invention has been made to solve the aforementioned problems, and it is an object of the present invention to provide an image recording apparatus which can measure the intensity of a light beam applied from a light source to an original, and, if the measured intensity of the light beam is lower than a required intensity level, expose the original to the lower intensity level light beam, so that a sufficiently appropriate image can be formed even if the light beam intensity is lower than required.

According to the present invention, there is provided an image recording apparatus for recording an image of an original document on a photosensitive recording sheet, the apparatus comprising a light source for emitting a light having an intensity, the image of the original document being scanned by the light at a given speed thereby providing an image bearing light, exposure means for exposing the photosensitive recording sheet to the image bearing light to form a latent image corresponding to the image on the original document while moving the photosensitive recording sheet at a speed equal to the given speed, wherein an exposure rate is determined by the intensity of the light, the moving speed of the photosensitive recording sheet and the scanning speed, developing means for developing the latent image into a visible image on the photosensitive recording sheet, light intensity measuring means for measuring the intensity of the light emitted from said light source and outputting a light intensity indicative signal, and exposure control means responsive to the light intensity indicative signal for controlling the moving speed of the photosensitive recording sheet and the scanning speed so that the exposure rate is maintained substantially constant.

Specifically, the scanning speed has been preset to a predetermined value when the intensity of the light is equal to or more than a predetermined level, and said exposure control means changes the moving speed of the photosensitive recording sheet and the scanning speed to be lower than the predetermined value when the light intensity indicative signal indicates that the intensity of the light is lower than the predetermined level.

With the above arrangement, if the intensity of the light measured by the light intensity measuring means is equal to or more than the predetermined level, then the photosensitive recording sheet is exposed to the image bearing light under a normal condition. If the measured intensity of the light is lower than the predetermined intensity level, then the photosensitive recording sheet is exposed to the lower level intensity light but the original document and the photosensitive recording sheet are moved at a speed lower than a normal speed.

BRIEF DESCRIPTION OF THE DRAWINGS

The present invention will be further described by way of non-limitative Example with reference to the accompanying drawings, in which.

DETAILED DESCRIPTION OF THE PREFERRED EMBODIMENTS

Figure 1:
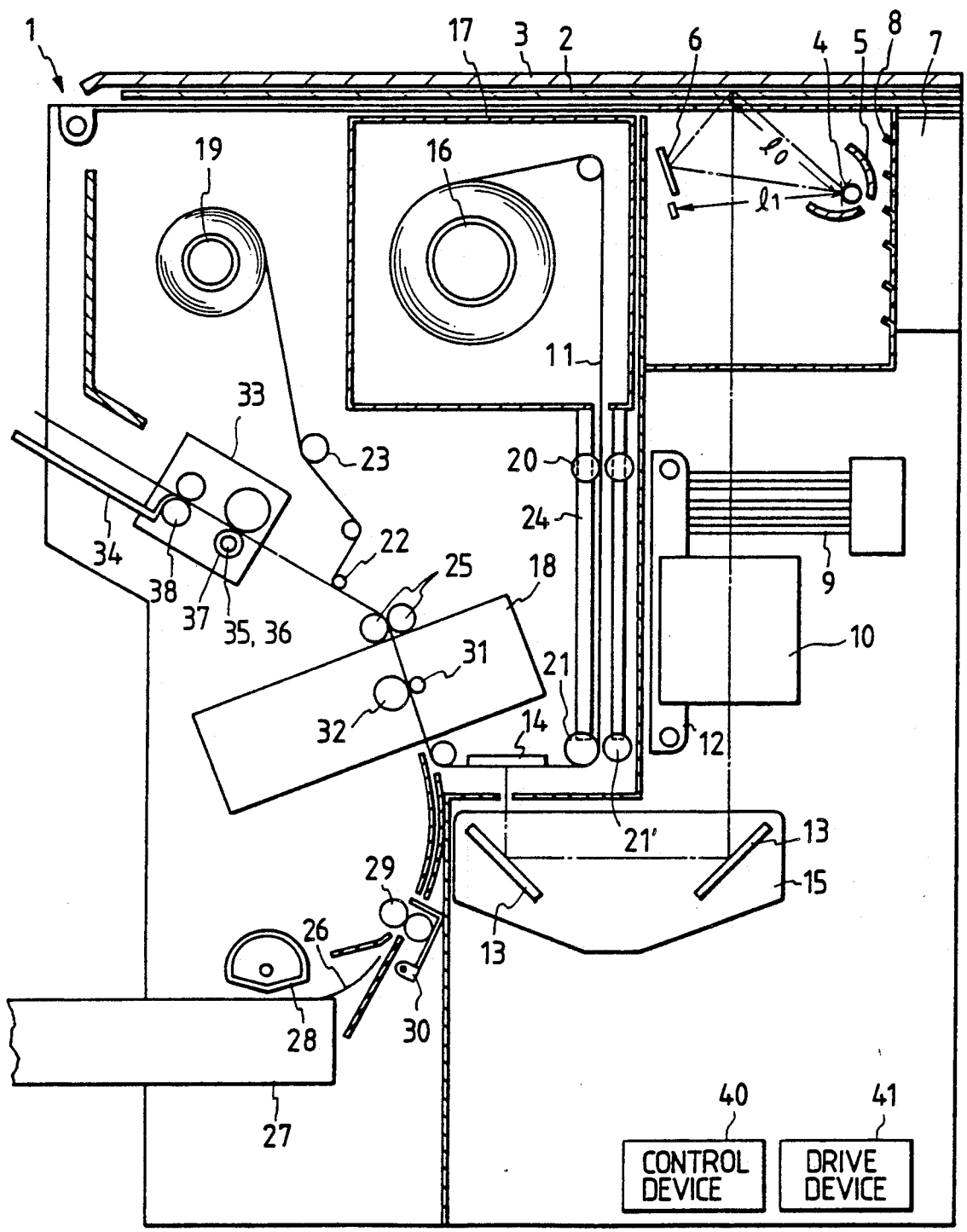
FIG. 1 is a schematic cross-sectional view of a photosensitive pressure-sensitive copying machine according to an embodiment of the present invention.

FIG. 1 schematically shows an image recording apparatus capable of performing a full-color recording or copying. In this apparatus, a transfer type image recording medium as disclosed in U.S. Pat. No. 4,399,209 to Sanders et al is used.

Briefly, this recording medium (hereinafter referred to as "microcapsule sheet") is coated with an immense number of microcapsules on one surface thereof. The microcapsules separately encapsulate a photo-curing (or photo-softening) resin and a chromogenic material of one of three primary colors comprising the colors of cyan, magenta and yellow. There is a separate image receiving sheet (hereinafter referred to as "developer sheet") having a surface coated with a developer material. When the microcapsule sheet is selectively exposed to light, the mechanical strength of the microcapsules in the exposed area is changed from soft to hard or vice versa to thereby form a latent image thereon corresponding to the pattern of the exposure. The latent image on the microcapsule sheet is developed under pressure to provide a visible image on the developer sheet by rupturing the microcapsules of weaker mechanical strength and having the chromogenic material released therefrom react with the developer material.

The recording apparatus, generally designated by the reference numeral 1 in FIG. 1 includes an upper panel assembly having a subject holder 2 of glass which is movable back and forth and a subject holder cover 3 that can be placed over the subject holder 2. A subject or original to be copied is put on the subject holder 2.

The copying machine 40 also has a light source placed in an upper righthand portion thereof below the subject holder 2 and comprising halogen lamp 4 extending in e direction normal to the direction in which the subject holder 2 is movable back and forth, and a semi-cylindrical reflecting mirror 5 disposed in surrounding relation to the halogen lamp 4. The light source emits a thin planar beam of light toward the lower surface of the subject holder 2. When the subject holder 2 moves, the light beam emitted from the halogen lamp 4 continuously irradiates the entire surface of the subject holder 2 from the lefthand to the righthand end thereof (as viewed in FIG. 1). The light beam from the light source passes through the transparent subject holder 2, and is then reflected by the original placed on the subject holder 2. The subject holder cover 3 covers the entire upper surface of the subject holder 2 so that the light beam applied to the subject holder 2 will not leak out from those areas of the subject holder 2 which are not covered by the original.

A reflector 6 is positioned on the lefthand side of the light source for applying light beams emitted from the halogen lamp 4 to the original highly efficiently. The reflector 6 reflects those emitted light beams which are not directed toward the subject holder 2 toward the subject holder 2. A fan 7 and louvers 8 for introducing ambient air into the copying machine are disposed on the righthand side of the halogen lamp 4. The air introduced by the fan 7 and the louvers 8 is efficiently applied to the subject holder 2 to cool the same.

The light beam reflected from the original on the subject holder 2 is directed downwardly and passes through a filter 9 and a lens 10. The filter 9 serves to pass desired wavelengths of light dependent on the sensitivity of a microcapsule-coated recording sheet 11 for adjusting the colors of a copied image. The lens is mounted on a lens attachment 12 which is slightly angularly adjustable with respect to the path of the light beam through the filter 9 and the lens 10.

The light beam converged by the lens 10 is directed 180° back by two reflecting mirrors 13, and then focused on the microcapsule sheet held closely against the lower surface of an exposure plate 14. The reflecting mirrors 13 are mounted on a mirror attachment 15 which is slightly positionally adjustable to vary the length of the light beam path and the focused condition.

The microcapsule sheet 11 is of a continuous elongate length end wound around a cartridge reel 16 which is placed in a removable cartridge 17 positioned below the subject holder 2. A leading end portion of the microcapsule sheet 11 extends through many rollers and pressure developing unit 18 toward a takeup reel 19. More specifically, the microcapsule sheet 11 drawn out of the cartridge 17 from its lower end is fed and guided by a feed roller 20, a guide roller 21, and a nip roller 21', and extends beneath the exposure plate 14, after which the recording sheet is supplied to the pressure developing unit 18. The microcapsule sheet 11 which has passed through the pressure developing unit 18 is guided by a separator roller 22 and an adjustment roller 24, and is then would on the takeup reel 19. The microcapsule sheet 11 discharged from the cartridge 17 remains unexposed by a light-shielding cover 24 before the recording sheet 11 reaches the exposure plate 14.

The speed at which the microcapsule sheet 11 is fed is controlled so as to be held at a constant level by means of a pair of feed rollers 25. The speed of travel of the microcapsule sheet 37 is the same as the speed at which the subject holder 2 is moved. Therefore, a latent image can be formed successively line by line on the microcapsule sheet 11 when it moves past the exposure plate 14.

A color developer sheet cassette 27 storing a stack of color developer sheets 26 is disposed below the pressure developing unit 14. One, at a time, of the color developer sheets 26 is taken out of the cassette 27 by a semi-circular roller 28. After the leading end of the color developer sheet 26 is positioned by rollers 29 and a resist gate 30, the color developer sheet 26 is fed into an inlet slot of the pressure developing unit 18.

The microcapsule sheet 11 and the color developer sheet 26 are closely held against each other when they are introduced into the pressure developing unit 18. The pressure developing unit 18 includes a smaller-diameter roller 31 and a backup roller 32. The micro-capsule-coated recording sheet 11 and the color developer sheet 26 are sandwitched and pressed together between the smaller-diameter roller 31 and the backup roller 32. At this time, a microcapsule layer on the recording sheet with the latent image formed thereon and a color developer layer on the color developer sheet 26 are held against each other. Those microcapsules in the microcapsule layer which are not exposed are ruptured under pressure, and a developed image is transferred onto the color developer sheet 26. The pressure developing unit 18 and a thermal fixing unit 33 (described later on) jointly serve as a process means for forming images.

The microcapsule sheet 11 and the color developer sheet 26 which have left the pressure developing unit 18 are fed by the feed rollers 25. Then, the microcapsule sheet 11 is separated from the color developer sheet 26 by the separator roller 22. After color development on the color developer sheet 26 is promoted and the color image is fixed by the thermal fixing unit 33, the color developer sheet 26 is discharged into a tray 34 with the developed image facing up. The thermal fixing unit 33 comprises a hollow heating roller 37 with a heater 35 and a temperature sensor 36 disposed therein, and a discharge roller 38. The separated microcapsule sheet 11 travels past the adjustment roller 23 and is wound around the takeup reel 19.

A light intensity sensor (light intensity measuring means) 39 for measuring the intensity of a light beam is located in any of positions where it does not receive the light reflected from the original and receives only the light from the exposure halogen lamp 4 or the light reflected from the reflecting mirrors 5 or the reflector 6. In the embodiment shown in FIG. 1, the light intensity sensor 39 is disposed below the reflector 6. However, the light intensity sensor 39 may be located anywhere provided that it is disposed in one of the above positions. The location of the sensor 39 with respect to the longitudinal direction of the halogen lamp 4 will be described later on.

In copying machine of the present invention, if the light intensity measured by the sensor 39 is lower than a preset intensity level, the recording sheet 11 is exposed at a lower exposure rate, as described later in detail. To effect such exposure rate control, the copying machine i has a control device 40 and a drive device 41 for driving the subject holder 2.

Figure 2:
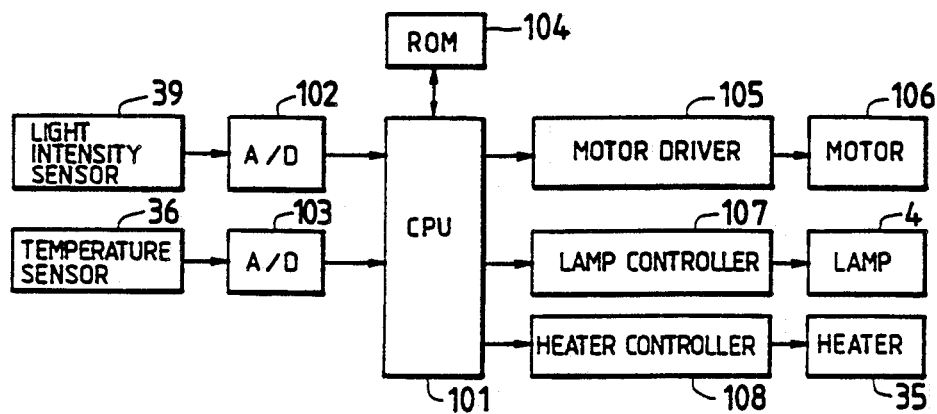
FIG. 2 is a block diagram of a control system.

A control system including the control device 40 for effecting the exposure rate control will be described with reference to FIG. 2. The control device 40 includes a central processing unit (CPU) 101 to which detected signals from the light Intensity sensor 39 and the temperature sensor 36 are applied through respective A/D converters 102, 103. According to a program stored in a ROM 104, the CPU 101 controls a drive motor 106 of the drive device 4 through a motor driver 105, the halogen lamp 4 through a lamp controller 107, and the heater 35 through a heater controller 108.

The drive motor 106 also drives, through transmission mechanisms (not shown), the subject holder 2, the feed roller 20, the guide roller 21, the feed rollers 25, the backup roller 32, the heater roller 37, and the discharge roller 38.

Operation of the copying machine thus constructed will be described below.

The subject holder cover 3 is lifted, and an original to be copied is placed on the subject holder 2. Then, an exposure start button (not shown) is depressed The subject holder 2 is moved to the right (FIG. 1) until the lefthand end of the subject holder 2 is directly above the light source. Then, the halogen lamp 4 is turned on, and the subject holder 2 is moved to the left. A light beam emitted from the halogen lamp 4 is reflected by the original on the subject holder 2, then passes through the filter 9 and the lens 10, and is also reflected by the two reflecting mirrors 13. Thereafter, the light beam is focused on the microcapsule sheet positioned underneath the exposure plate 14. At this time, the recording sheet 11 is moved to the left beneath the exposure plate 14 at the same speed as the speed of movement of the subject holder 2. The image of the original on the subject holder 2 is thus accurately formed as a latent image on the recording sheet 37.

As the subject holder 2 moves to the left, a color developer sheet 26 is taken out of the cassette 27 by the semicircular roller 28 and superposed on the exposed area of the microcapsule sheet 11 in the pressure developing unit 18. In the pressure developing unit 18, the latent image on the recording sheet 11 is developed and transferred to the color developer sheet 26. Thereafter, the image on the color developer sheet 26 is thermally fixed by the thermal fixing unit 33, and then the color developer sheet 26 is discharged out of the copying machine 1. The microcapsule sheet 11 which has left the pressure developing unit 18 is then wound around the takeup reel 19. When the righthand end of the subject holder 2 reaches the position directly above the light source, the copying of the original is completed, and the halogen lamp 4 is de-energized.

Exposure control will ba described below with reference to the flowchart of FIG. 3.

When the exposure start switch is turned on in a step S1, the exposure rate and the light beam intensity are set in a step S2 to a normal preset exposure rate V1 and a normal preset light intensity level A1 which are read from a table stored in the ROM 104. Thereafter, the halogen lamp 4 is turned on in a step S3. A step S4 then waits until the intensity of light emitted from the halogen lamp 4, as measured by the light intensity sensor 39, reaches the preset light intensity level A1. If the measured intensity of light from the halogen lamp 4 has reached the preset light intensity level A1, then a copying process including exposure and image fixing, as described above, is started in a step S5. Since the original is exposed and the image is fixed at the exposure rate V1, at this time, the conditions such as pressure of the smaller-diameter roller 31 and the backup roller 32 of the pressure developing unit 18, which conditions need to be adjusted depending on the exposure and image fixing rate, are controlled so as to be of optimum preset values at the exposure and image fixing rate V1.

If the measured intensity of light from the halogen lamp 4 has not reached the preset light intensity level A1 within a predetermined period of time (i.e., if the answer to a step S6 is NO), then the light beam intensity is set in a step S7 to a preset light intensity level A2 at an exposure rate V2.

If the detected intensity of light from the halogen lamp 4 has reached the preset light intensity level A2 (i.e., if the answer to a step S8 is YES), then exposure and image fixing are effected at the exposure rate V2. The conditions such as pressure of the smaller-diameter roller 31 and the backup roller 32 are also controlled at this time so as to be of optimum preset values at the exposure rate V2.

If the preset light intensity level A2 has not been reached (i.e., if the answer to the step S8 is NO), then the exposure rate and the light intensity are set to V3, A3. The exposure rate and the light intensity are successively reset to V4, A4, . . . , Vn, An in a step S9 until the preset light intensity is reached in a step S10. Then, the original is exposed and the image is fixed at the exposure rate and under the preset conditions such as pressure of the pressure developing unit 18 at the time the detected intensity of light of the halogen lamp 4 reaches the preset light intensity. If the detected intensity of light of the halogen lamp 4 has not finally reached the preset light intensity An (i.e., if the answer to the step S10 is NO). then a light intensity shortage is indicated as an error and the copying apparatus is shut off in a step S11.

Figure 3:
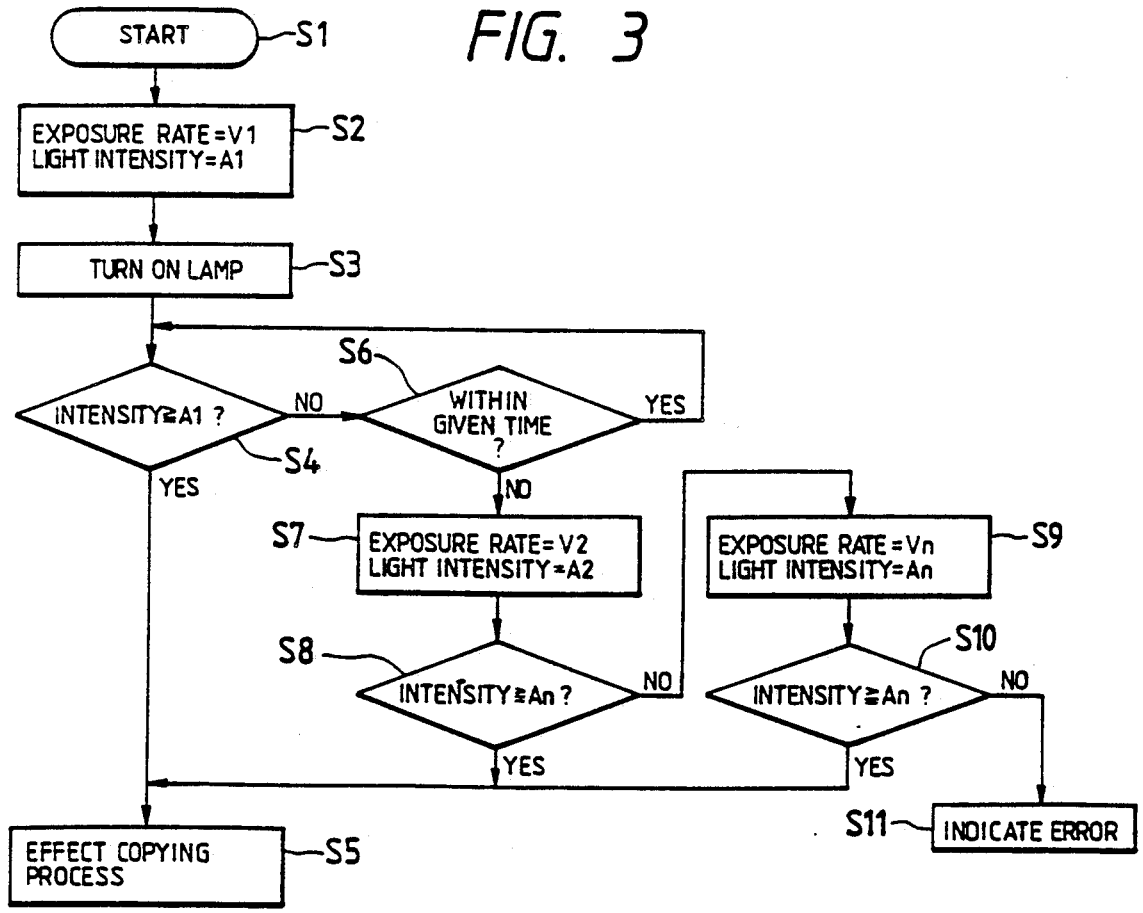
FIG. 3 is a flowchart of a control sequence.

As a modification of the flowchart of FIG. 3, the step of S7 may be replaced with a step in which an adequate exposure rate V is calculated from a measured light intensity A according to a given equation, and which is followed by the copying process in the step S5.

While the subject holder 2 is movable in the illustrated embodiment, the present invention is not limited to the movable subject holder, but is also applicable to a copying machine of the type in which the optical system is moved to expose an original to scanning light.

Figure 4A:
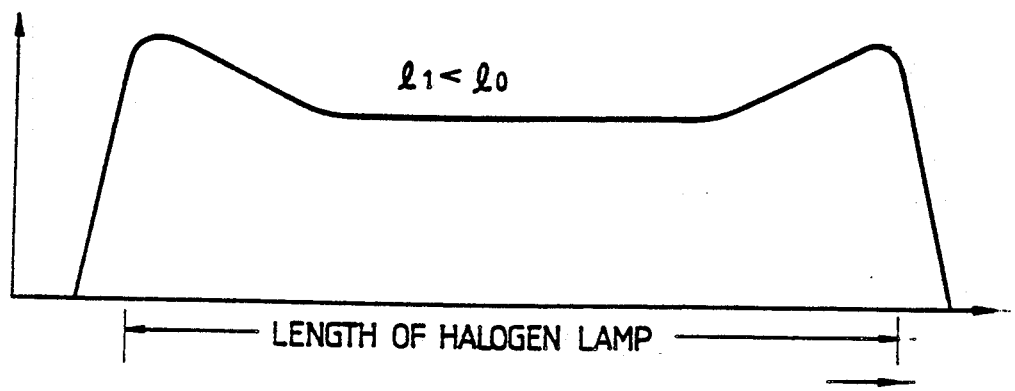
FIG. 4 is a set of diagrams showing distribution patterns of intensities of light from a halogen lamp at different lengths of an optical path.
Figure 4B:
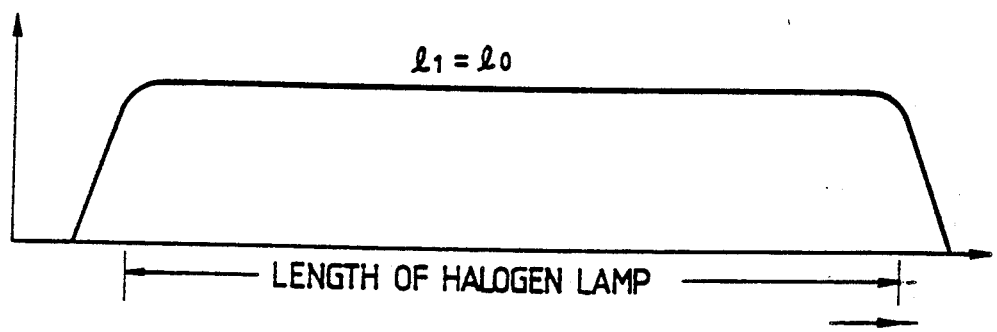
Figure 4C:
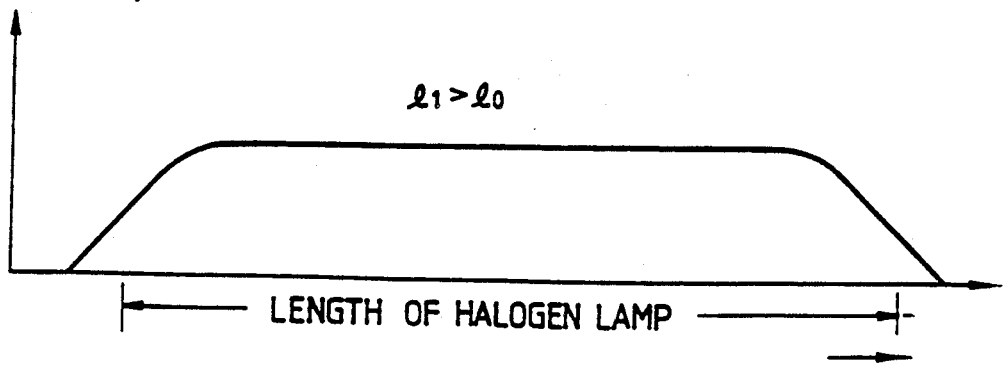

The light intensity sensor 39 may be located anywhere along the longitudinal direction of the halogen lamp 4. Actually, however, the filament in the halogen lamp 4 is wound differently at ends and center thereof to adjust the intensity of emitted light in order that the intensity of light light applied from the halogen lamp 4 to the surface of the original will not be lower at the ends of the original. Consequently, the distribution pattern of light intensities in the longitudinal direction of the halogen lamp 4 varies depending on the length of the optical path from the sensor 39 to the light source. As shown in FIGS. 4(a), 4(b), and 4(c), the light intensity distribution greatly varies at the ends of the halogen lamp 4 depending on the length of the optical path, and the intensity of light as measured by the sensor 39 also largely varies depending on the position of the sensor 39 along the longitudinal direction of the halogen lamp 4. For these reasons, the sensor 39 should preferably be positioned near the center of the halogen lamp 4 where the measured light intensity varies less along the longitudinal direction of the halogen lamp 4.

In each of FIGS. 4(a), 4(b), 4(c), the horizontal axis represents the longitudinal direction of the halogen lamp 4 (the length of the halogen lamp 4 is indicated by a range marked with arrows, and the vertical axis represents the intensity of light emitted by the halogen lamp 4. FIGS. 4(a), 4(b), 4(c) show light intensity distribution patterns when the distance 11 from the halogen lamp 4 to the light intensity sensor 39 is smaller than, equal to, and larger than, respectively, the optical path length 10 from the halogen lamp 4 to the original.

With the present invention, as described above, the intensity of light emitted from the light source is measured, and if the measured light intensity is lower than a preset light intensity level, then the original is exposed to the light at a lower exposure rate. Therefore, even when the intensity of light from the light source does not reach a desired level because a higher light source intensity is required or the voltage of the power supply has dropped, the original can adequately and sufficiently be exposed to light. As a result, copying failures which have heretofore been experienced can be avoided, and good images can be formed.

While the present invention has been described with reference to a specific embodiment, a variety of changes or modification may be made without departing from the scope and spirit of the invention. For example, a so-called self-contained type photosensitive pressure-sensitive recording sheet may be used instead of the transfer-type photosensitive pressure-sensitive recording sheet. The self-contained type recording sheet is disclosed in U.S. Pat. No. 4,440,846, in which an encapsulated chromogenic material or dye precursour and a developer material are co-deposited on one surface of a single substrate as one layer or as two contiguous layers.

What is claimed is:

1. An image recording apparatus for recording an image of an original document on a photosensitive recording sheet, the apparatus comprising:

a light source for emitting a light having an intensity, the image of the original document being scanned by the light at a given speed thereby providing an image bearing light;

exposure means for exposing the photosensitive recording sheet to the image bearing light to form a latent image corresponding to the image on the original document while moving the photosensitive recording sheet at a speed equal to the scanning speed, wherein an exposure rate is determined by the intensity of the light and the moving speed of the photosensitive recording sheet;

developing means for developing the latent image into a visible image on the photosensitive recording sheet;

light intensity measuring means for measuring the intensity of the light emitted from said light source and outputting a light intensity signal indicative of the measured light intensity; and control means for controlling the moving speed of the photosensitive recording sheet so that the exposure rate is maintained substantially constant, said control means comprising a central processing unit, analog-to-digital converting means connected to said light intensity measuring means for receiving the analog signal and converting the analog signal to a digital signal, the digital signal being fed to said central processing unit, and storage means for storing a table containing a predetermined number of combinations of the moving speed of the photosensitive recording sheet and the intensity of the light, wherein said central processing unit reads a first combination of a first moving speed and a first light intensity out of said storage means, turns on said light source, waits until the digital signal indicates that the measured light intensity reaches the first light intensity, allows said exposure means and said developing means to be activated so that the photosensitive recording sheet is exposed at the first moving speed if the measured light intensity has reached the first light intensity, reads a second combination of a second moving speed and a second light intensity out of said storage means if the measured light intensity has not reached the first light intensity within a predetermined period of time, and allows said exposure means and said developing means to be activated so that the photosensitive recording sheet is exposed at the second moving speed if the measured light intensity has reached the second light intensity.

2. An image recording apparatus according to claim 1, wherein said photosensitive recording sheet comprises a first sheet and a second sheet, said first sheet carrying on its surface a first material and said second sheet carrying on its surface a second material, said first material comprising a photosensitive material and a chromogenic material of a color selected from the colors comprising cyan, magenta and yellow, said second material comprising a developer material, said photosensitive material and said chromogenic material being encapsulated in a pressure rupturable microcapsule and a mechanical strength of said microcapsule varies when exposed to said light, said visible image being formed upon reaction of said chromogenic material with said developer material.

3. An image recording apparatus according to claim 1, wherein said light source comprises an elongated halogen lamp extending in a direction perpendicular to a direction in which the original document is scanned, and wherein said light intensity measuring means is disposed in a position to receive a light emitted from a central portion of said halogen lamp.

4. An image recording apparatus according to claim 3, wherein said halogen lamp has a filament extending in a longitudinal direction of said halogen lamp, the filament being wound differently at end portions and central portion thereof.

5. An image recording apparatus for recording an image of an original document on a photosensitive recording sheet, the photosensitive recording sheet comprising a first sheet and a second sheet, the first sheet carrying on its surface a second a first material and the second sheet carrying on its surface a second material, the first material comprising a photosensitive material and a chromogenic material of a color selected from the colors comprising cyan, magenta and yellow, the second material comprising a developer material, the photosensitive material and the chromogenic material being encapsulated in a pressure rupturable microcapsule and a mechanical strength of the microcapsule varies when exposed to light, a visible image being formed upon reaction of the chromogenic material with the developer material, the apparatus comprising:

a light source for emitting a light having an intensity, the image of the original document being scanned by the light at a speed, thereby providing an image bearing light;

exposure means for exposing the first sheet to the image bearing light to form a latent image corresponding to the image on the original document while moving the first sheet at the speed equal to the scanning speed, wherein an exposure rate is determined by the intensity of the light and the moving speed of the first sheet;

developing means for developing the latent image into a visible image on the first sheet to provide the visible image on the second sheet;

light intensity measuring means for measuring the intensity of the light emitted from said light source and outputting an analog signal indicative of the measured light intensity;

control means for controlling the moving speed of the first sheet so that the exposure rate is maintained substantially constant, said control means comprising a central processing unit, analog-to-digital converting means connected to said light intensity measuring means for receiving the analog signal and converting the analog signal to a digital signal, the digital signal being fed to said central processing unit, and storage means for storing a table containing a predetermined number of combinations of the moving speed of the fist sheet and the intensity of the light, wherein the moving speed of the first sheet has been preset to a predetermined value when the intensity of the light is equal to or more than a predetermined level, said control means changing the moving speed of the first sheet to be lower than the predetermined value when the digital signal indicates that the intensity of the light is lower than the predetermined level; and fixing means for thermally fixing the visible image on the photosensitive recording sheet, wherein means performs fixing of the visible image to comply with the change of the moving speed of the first sheet.

6. An image recording apparatus according to claim 5, wherein said light source comprises an elongated halogen lamp extending in a direction perpendicular to a direction in which the original document is scanned, and wherein said light intensity measuring means is disposed in a position to receive a light emitted from a central portion of said halogen lamp.

7. An image recording apparatus according to claim 6, wherein said halogen lamp has a filament extending in a longitudinal direction of said halogen lamp, the filament being wound differently at end portions and central portion thereof.

8. An image recording apparatus according to claim 7, wherein said developing means performs development to comply with the change of the moving speed of the first sheet.

* * * * *